United States Patent
Ghoshal

[19]

[11] Patent Number: 6,034,408
[45] Date of Patent: Mar. 7, 2000

[54] SOLID STATE THERMAL SWITCH

[75] Inventor: Uttam Shyamalindu Ghoshal, Austin, Tex.

[73] Assignee: International Business Machines Corporation, Armonk, N.Y.

[21] Appl. No.: 09/078,705

[22] Filed: May 14, 1998

[51] Int. Cl.[7] .................................................. H01L 31/00
[52] U.S. Cl. ......................... 257/467; 257/347; 257/617; 257/930
[58] Field of Search ................................... 257/467, 468, 257/469, 470, 347, 348, 350, 617, 707, 930

[56] References Cited

U.S. PATENT DOCUMENTS 5,463,233  10/1995  Norling .................................. 257/254
5,867,990   2/1999  Ghoshal .................................. 62/3.7

OTHER PUBLICATIONS

Gerald Mahan et al., "Thermoelectric Materials: New Approaches To An Old problem," American Institute of Physics Today, Pp. 42–47, Mar. 1997.

Boris Moyzhes, "Possible Ways for Efficiency Improvement Of Thermoelectric Materials," IEEE 15th International Conference on Thermoelectrics, Pp. 183–187, 1996.

L.D. Hicks et al., "Experimental Study of the Effect of Quantum–Well Structures on the thermoelectric Figure of Merit," IEEE 15th International Conference on Thermoelectrics, Pp. 450–453, 1996.

*Primary Examiner*—Sara Crane
*Attorney, Agent, or Firm*—Casimer K. Salys; Andrew J. Dillon

[57] ABSTRACT

A solid state thermal switch providing thermal conductivity in an ON state and enhanced thermal isolation in an OFF state. The thermal switch is manufactured on a substrate by forming an oxide layer under a thin semiconducting layer. The thin semiconducting layer can be made from silicon or a silicon germanium lattice structure. The thin silicon layer is cracked by a neutron bombardment process. A drain and a source are then etched into the thin silicon layer. Cracks in the thin silicon layer disrupt quiescent thermal conductivity in the electron transport layer between the gate and source when the solid state thermal switch is in the OFF state. The thin semiconducting layer transports electrons and heat when the solid state thermal switch is in the ON state. The cracks created in the silicon layer provide thermal isolation from the drain to the source when the thermal switch is in an OFF state and allow heat conduction when the solid state thermal device is in the ON state.

15 Claims, 3 Drawing Sheets

SOLID STATE THERMAL SWITCH

CROSS-REFERENCE TO RELATED APPLICATIONS

The present application is related to co-pending U.S. patent application Ser. No. 08/988,621 (IBM Docket No. AT9-97-707) filed Dec. 10, 1997, U.S. patent application Ser. No. 08/988,429 (IBM Docket No. AT9-97-710) filed Dec. 10, 1997 and U.S. patent application Ser. No. 09/067,148 (IBM Docket No. AT9-98-002). All of the above mentioned patent applications are assigned to the assignee of the present application.

BACKGROUND OF THE INVENTION

1. Technical Field

The present invention relates in general to an improved thermal switch, and in particular to an improved solid state thermal switch for selectively controlling heat transfer to and from a thermoelectric device. Still more particularly, the present invention relates to a system and method for the manufacturing of solid state thermal switches utilizing integrated circuit manufacturing techniques.

2. Description of the Related Art

Conventional cooling systems, such as found in a refrigerator, utilize vapor compression refrigeration cycles to provide heat transfer. Vapor compression cooling requires significant moving hardware, including at a minimum, a compressor, a condenser, an evaporator, and related coolant transfer plumbing. Miniature vapor compression cooling is not available for small cooling applications. However, small cooling applications are highly desirable.

Semiconductors and superconductors have enhanced performance at lower temperatures. CMOS logic can operate materially faster at lower temperatures. For example, if CMOS logic devices are operated at −50° C., their performance is improved by 50 percent over room ambient temperature. Liquid nitrogen cooling of CMOS logic to −196° C. has shown a 200 percent improvement in speed.

Similar benefits have been shown for integrated circuit wiring. Wiring resistances decrease by a factor of two for integrated circuits operated at −50° C. in comparison to room ambient temperature operation.

Thus, sub-ambient temperature operation of integrated circuit logic devices, such as field effect transistors, as well as the interconnect wiring can materially improve integrated circuit performance. However, accomplishing such cooling in the confines of ever decreasing areas poses new challenges.

Thermoelectric cooling is one alternative that has found some utilization given the compact size of Peltier devices. Peltier device thermoelectric cooling is very reliable because such devices are solid state. The utilization of thermoelectric devices in industry has, to date, been restricted to very specialized applications. Due to inefficiencies, very few applications can effectively utilize thermoelectric effects. The undesirable properties of thermoelectric devices, such as high cost and low efficiency, are outweighed by the desirable properties of thermoelectric devices. Recently, there have been significant advances in material technology, many attributable to advances made by the semiconductor industry. The inefficiency of thermoelectric devices is a key negative aspect of implementing a thermoelectric cooling design. A Peltier device cooling system typically has an efficiency in the range of 20 percent for a relatively nominal temperature differential between the hot sink and ambient temperature conditions.

Utilizing a Peltier cooling system to cool at a rate of one watt and attain a sub-ambient temperature of 0° C. requires that the system be powered with five watts. As the amount of heat to be transferred increases, the total power to be dissipated into the ambient mandates large convection devices. Large power supply circuits must also be utilized.

Therefore, Peltier device thermoelectric cooling has not been considered a broadly applicable technology for cooling integrated circuits and improving integrated circuit performance. However, the introduction of an effective solid state thermal switch could boost the efficiency of thermoelectric coolers when utilized in novel configurations as disclosed in cross referenced copending patent applications referred to in the cross reference section of this patent application. The cross-referenced copending patent applications, disclose novel switching for interrupting thermal conduction to and from a Peltier device.

Peltier cooling devices are typically on the order of a few microns in dimension. Micron sized mechanical switches for connecting and disconnecting to thermoelectric devices provides a less than perfect solution. Construction of mechanical micro-miniature thermal switches is not a well developed art. Mechanical micro-miniature switch assemblies would require the manufacture and assembly of contacts, wipers and actuation mechanism which are microscopic. Mechanical micro-miniature thermal switches are costly. Further micro-miniature switch assemblies are unreliable and have short lifetimes.

Generally, moving contacts have a very limited life in comparison to solid state devices. The life of a electro-mechanical switch is measured in cycles. The useful life of a switch might be on the order of a few million cycles. If an electro-mechanical switch must be cycled at a kilohertz, the short lifetime of the switch severely limits practical applications.

The importance of thermal switching of Peltier devices can be explained by classical equations. In operation, a Peltier device transports electrons from a cold source at temperature $T_{cold}$ to a hot sink at temperature $T_{hot}$ in response to an electric field placed across the Peltier device.

$$q = \alpha T_{cold} I - \tfrac{1}{2} I^2 R - K \Delta T \qquad \text{Equation 1}$$

The net heat energy transported by a Peltier device is composed of three elements. In equation 1, the first element represents the Peltier effect (thermoelectric) contribution, the second element defines negative Joule heating or resistive effects, and the third element defines negative conductivity effects of the heat. The thermoelectric component is composed of the Seebeck coefficient, the temperature of operation ($T_{cold}$) and the current through the (TE) device.

Approximately one half of the Joule heating produced by the bias current is conducted to the cold source and the remainder to the hot sink. Lastly, the negative element attributable to thermal conduction represents the heat flow or heat conduction through the Peltier device. K is the thermal conductivity of the Peltier device from the hot sink to the cold source. Selective interruption of the heat transfer between a Peltier device and a heat sink has proven superior results as discussed in the copending patent applications referenced above. However, the thermal switch must have low thermal conductivity in the "OFF" state.

In equation 1, the thermoelectric component of the heat transport increases linearly with the current through the Peltier device and the Joule heating increases in proportion to the square of the current. Alternately described, the resistive heating exponentially increases due to the current through the Peltier device while the cooling effect linearly increases with increased current flow. The thermal conduction is also in direct proportion to the temperature differential between the cold source and the hot sink. Equation 1 clearly reflects how quickly a Peltier device in a classical configuration becomes inefficient as the cold source and hot sink diverge in temperature.

Equation 2 below defines a coefficient of performance for a Peltier device. The coefficient of performance is the ratio of the net heat energy transported at low temperature to the power consumed by the Peltier device. For a typical Peltier device made from bismuth telluride material, the coefficient of performance is less than 0.3.

$$\eta = \frac{\text{heat transport}}{\text{power consumption}} = \frac{\alpha T_{cold} I - 1/2 I^2 R - K\Delta T}{I^2 R + \alpha I \Delta T} \quad \text{Equation 2}$$

Note that the numerator of equation 2 represents the net cooling capability of the Peltier device. The denominator of equation 2 represents the total energy provided by an external D.C. power supply. The individual elements of the numerator were described in reference to equation 1. The first element in the denominator is the total Joule heating, while the second element is the heat energy transport work done by the Peltier device in moving energy from the $T_{cold}$ source to the $T_{hot}$ sink. Based upon this relationship, the maximum coefficient of performance possible in the configuration of a typical Peltier device is given by equation 3.

$$\eta_{max} = \frac{T_{cold}}{\Delta T} \frac{\gamma - \frac{T_{hot}}{T_{cold}}}{\gamma + 1} \quad \text{Equation 3}$$

The parameter $\gamma$ can be expressed in terms of the Seebeck coefficient $\alpha$, electrical conductivity $\sigma$ and thermal conductivity $\lambda$ as set forth in equation 4.

$$\gamma = 1 + \frac{\gamma^2}{RK} \frac{T_{hot} + T_{cold}}{2} = 1 + \frac{\alpha^2 \sigma}{\lambda} \overline{T} = 1 + Z\overline{T} \quad \text{Equation 4}$$

The first factor in equation 3 $T_{cold}/\Delta T$ is the maximum efficiency possible for any heat pump operating between two thermal sinks $T_{cold}$ and $T_{hot}$. $T_{cold}/\Delta T$ is commonly referred to as the Carnot efficiency. The second factor represents the non-ideal thermoelectric cooling, which can also be characterized by a figure of merit $Z\overline{T}$. As $\eta \rightarrow (T_{cold}/\Delta T)$ as $\gamma \rightarrow \infty$. To date it has been very difficult to develop a thermoelectric material in a configuration which yields high values of $Z\overline{T}$.

Another constraint of Peltier device cooling is that only a limited temperature excursion below ambient temperature is attainable. The temperature differential limitation arises from the fact that the effective temperature span is constrained by efficiency. Efficiency of a thermoelectric device degrades quickly with an increasing temperature differential between a hot sink and a cold source. The maximum temperature differential possible $T_{max}$ is given by equation 5 below.

$$\Delta T_{max} = \tfrac{1}{2} Z T_{cold}^2 \quad \text{Equation 5}$$

For bismuth telluride having a $Z\overline{T}$ of approximately 0.3, $T_{max}$ is 45° K. at 300° K., where 32° f. is equivalent to 273 K.

Thus, there are a number of very fundamental constraints on efficiency and differential temperature that limit the practical utilization of conventional static thermoelectric cooling applications. Particularly, statically coupled applications which utilize ambient temperatures to dissipate the heat are impracticable.

Equation 1 is the classic equation for static operation of a Peltier device. However, equation 1 does not apply when thermal and electrical switching are introduced to create a non-linear system. Many inefficiencies of equation 1 can be avoided if an effective thermal switch is implemented.

Typically, each Peltier device is small in dimension and can only transport a finite amount of heat. Therefore, to produce a cooling effect of desired magnitude many Peltier devices must be connected together. Selectively thermally coupling of Peltier devices to heat sources or sinks utilizing thermal switches greatly increase the efficiency of operation and the inherent differential temperature limitation.

Thermal conductivity within a semiconductor occurs from mobile carriers and phonon conductivity. Phonon conductivity in a lattice structure is due to changes in force which atomic planes exert on neighboring planes. The lattice force is due to vibrations of the lattice structure about normal lattice sites. Thermal transfer due to phonon conductivity is relatively unrelated to current flow. Phonon conduction is the same mechanism by which sound is transmitted through a crystal structure.

Thus, the mechanism of Peltier heating and cooling is one of heat storage or release by mobile-carrier populations, and the Peltier coefficient is the energy carried per unit charge. During operation, carriers are injected into a region where their energy is significantly different from the average thermal energy of the normal carrier population.

Due to their substantial numbers and energy difference, injected carriers change the average energy of a region and therefore, the region which the carriers enter changes in temperature. A temperature difference between two surfaces bounding a material usually results in the flow of thermal energy from the hotter area to a cooler area.

Transistors, including metallic oxide semiconductor field effect transistors (MOSFETS), can be utilized as lossy thermal switches. When the gate voltage of a MOSFET is below its threshold voltage, the MOSFET is "OFF". When the MOSFET is "OFF" there is minimal current flow. Hence, the thermal conduction due to the flow of electrons is negligible. However, even in the OFF state, thermal conduction across the MOSFET due to lattice conductivity is significant and cannot be controlled by the MOSFET. Thus, MOSFET thermal switches are lossy and provide poor thermal isolation.

It should therefore be apparent that there is a need for a solid state thermal switch to provide intermittent thermal coupling to thermoelectric devices. Further, a miniature solid state thermal switch which has low thermal conductance in the OFF state and a high thermal conductance in the ON state would be highly desirable. Additionally, a thermal switch which can be produced utilizing integrated circuit manufacturing techniques is in demand.

SUMMARY OF THE INVENTION

It is therefore one object of the present invention to provide an improved thermal switch.

It is another object of the present invention to provide an improved solid state thermal switch to selectively control heat transfer to and from a thermoelectric device.

It is yet another object of the present invention to provide a method and system for the manufacturing of solid state thermoelectric switches utilizing integrated circuit manufacturing techniques.

The foregoing objects are achieved as is now described. A solid state thermal switch is disclosed providing thermal conductivity in an ON state and enhanced thermal isolation in an OFF state. The thermal switch is manufactured on a substrate by forming an oxide layer under a thin semiconducting layer. The thin semiconducting layer can be made from silicon or a silicon germanium lattice structure. The thin silicon layer is cracked by a neutron bombardment process. A drain and a source are then etched into the thin silicon layer. Cracks in the thin silicon layer disrupt quiescent thermal conductivity in the electron transport layer between the gate and source when the solid state thermal switch is in the OFF state. The thin semiconducting layer transports electrons and heat when the solid state thermal switch is in the ON state. The cracks created in the silicon layer provide thermal isolation from the drain to the source when the thermal switch is in an OFF state and allow heat conduction when the solid state thermal device is in the ON state.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
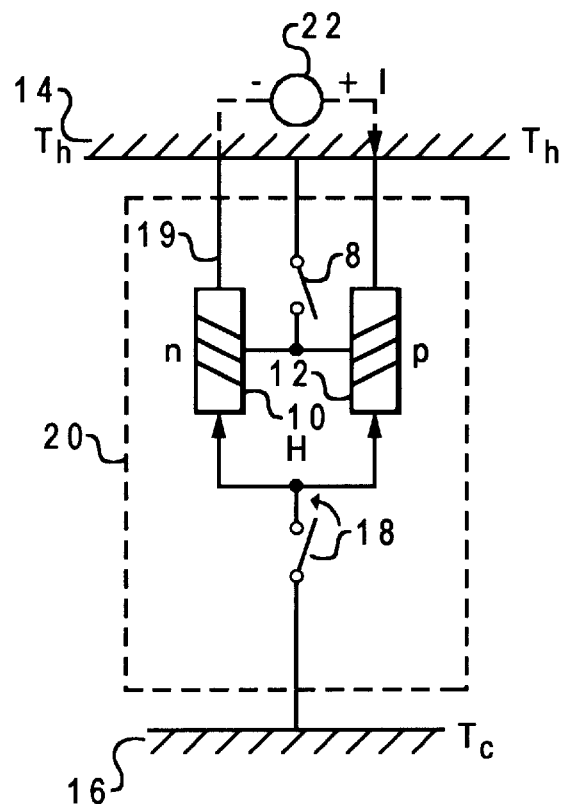
FIG. 1 depicts a new and novel method of controlling heat transfer by thermally connecting and disconnecting thermoelectric devices in accordance with the method and system of the present invention.

With reference now to the figures and in particular with reference to FIG. 1, there is depicted a novel interconnection of two thermoelectric cooling devices in accordance with the present invention. The thermoelectric cooling devices depicted are commonly referred to as a Peltier device. A Peltier device is made from two dissimilar materials which produce heat transfer when an electrical current is passed between them. The heat transfer of Peltier devices can be utilized for cooling an area referred to herein as cold source 16.

The embodiment of FIG. 1 utilizes two thermoelectric elements, N-type thermoelectric element 10 and P-type thermoelectric element 12, wherein the N-type thermoelectric element has N impurities and the P-type thermoelectric element has P impurities. Alternating N-type thermoelectric elements and P-type thermoelectric elements allow the shared utilization of a single power source.

In FIG. 1, hot sink 14 is heated and cold source 16 is cooled by thermoelectric element 20. Thermal switch 18 thermally couples cold source 16 to N-type thermoelectric element 10 and to P-type thermoelectric element 12 when closed.

It is desirable to implement a thermal switch with minimal thermal coupling when the thermal switch is open or in an OFF state. Alternately, a high thermal impedance or thermal resistance is desirable when thermal switch 18 is in an OFF state. However, good thermal conduction is required when thermal switch 18 is ON or closed.

Thermoelectric element 20 is continuously coupled to hot sink 14 through electrical conductor 19 which creates a thermal path. To enhance thermal conduction, switch 8 might be placed between thermoelectric element 20 and hot sink 14. Thermoelectric element 20 is thermally coupled to cold source 16 through thermal switch 18. Switching of thermal switch 18 and switch 8 allows selective thermal coupling of thermoelectric element 20 to convection devices. Higher efficiencies can be attained by switching thermoelectric devices.

As embodied in FIG. 1, power source 22 provides a voltage across thermoelectric element 20 which produces an electrical current. A few millivolts across thermoelectric element 20 produces a current on the order of an ampere.

In a preferred embodiment, power source 22 supplies current pulses to thermoelectric element 20. However, a switch can be placed in the conduction path of thermoelectric element 20 to provide the pulsed current to thermoelectric element 20. As illustrated by equation 1 above, Peltier cooling increases with increasing current.

Thermal and electrical switching allows cycling of thermoelectric element 20. At the start of a cycle, the temperature of thermoelectric element 20 is at a temperature of $T_{hot}$ by virtue of the thermal coupling to hot sink 14. Upon a current pulse, thermoelectric element 20 quickly establishes a relative temperature differential between hot sink 14 and cold source 16. The temperature differential allows heat transfer from cold source 16 through thermal switch 18 to hot sink 14.

Within approximately three milliseconds of the leading edge of the current pulse, Joule heating effects due to resistance within thermoelectric element 20, elevate the average temperature of thermoelectric element 20 such that the net Peltier heat transfer through thermoelectric element 20 begins to decrease. At the trailing edge of the current pulse, thermal switch 18 is opened, disconnecting thermal coupling from thermoelectric element 20 to cold source 16.

The residual thermal energy in thermoelectric element 20 at the time of thermal switch disablement elevates the temperature sufficiently to provide an exponentially decaying heat transfer between thermoelectric element 20 and hot sink 14. During the decaying, thermal transfer switch 8 can be closed to provide a low thermal impedance path from thermoelectric element 20 to hot sink 14. When the temperature of thermoelectric element 20 has decayed to a temperature approaching hot sink 14, the cycle is repeated.

The transient character of the operation acknowledges that thermoelectric heat transfer occurs immediately upon the receipt of a relative voltage whereas Joule heating and subsequent thermoelectric element conduction loss are delayed effects. Thus, the invention relies on the different time scales and time constants of Peltier cooling, resistance heating and thermal conduction.

FIG. 1 illustrates one application which can effectively utilize a solid state thermal switch. However, many applications could utilize a solid state thermal switch and the implementation depicted is only one such application. Thermal islands could further exploit this novel approach with effective solid state thermal switches. The implementation depicted should not be construed to limit the scope of applications for which a solid state thermal switch could be utilized.

Figure 2:
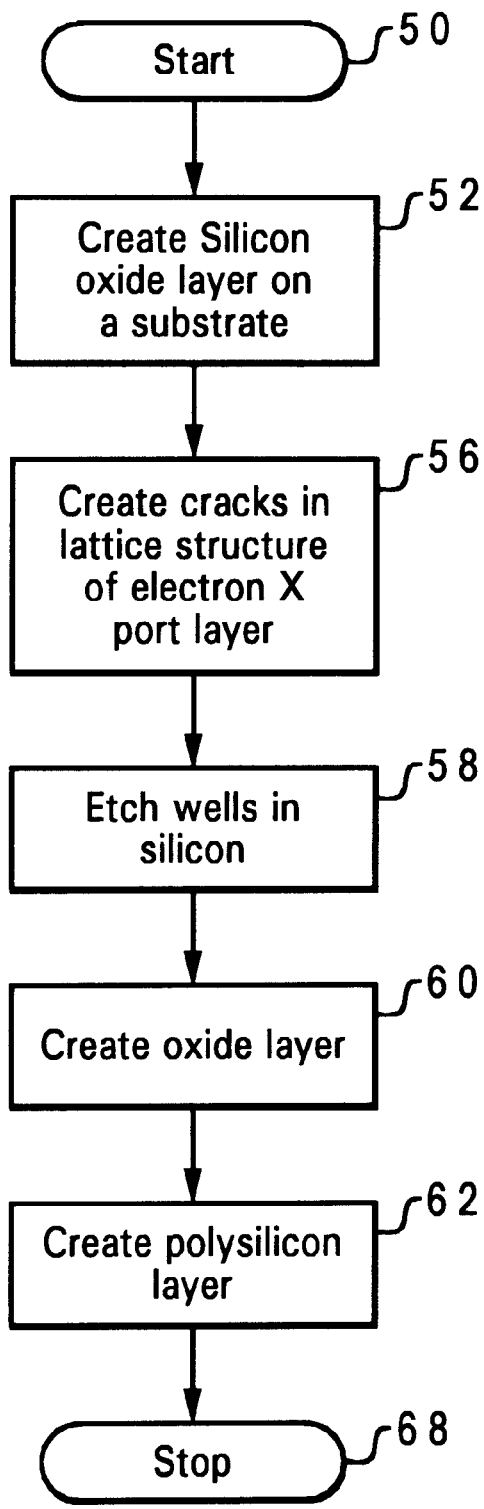
FIG. 2 illustrates a high level logic flow chart for a method of manufacture of a preferred embodiment in accordance with the method and system of the present invention.

Referring to FIG. 2, a high level logic flow chart of a method which can be utilized to manufacture a solid state thermal switch utilizing many known MOSFET manufacturing techniques is illustrated. The process begins in block 50 and thereafter proceeds to block 52. As depicted in block 52, a layer of silicon oxide is created on a substrate material. A widely utilized substrate material is silicon.

A silicon oxide layer can be created by various methods. One method is referred to by those skilled in the art as Separation by Implantation of Oxygen (SIO), SIMOX or SOI CMOS. In a typical SIO method, oxygen is implanted in a single crystal silicon wafer by a bombardment technique which controls the depth of penetration of oxygen atoms. Next, the wafer is annealed so that a uniform layer of silicon oxide is formed below a thin layer of silicon. The thin layer of silicon has been penetrated by the oxygen atoms and is utilized as the electron transport layer.

An alternate method for forming a layer of silicon oxide on a silicon substrate is Selective Epitaxial Growth (SEG). In a SEG process, silicon is selectively grown epitaxially over an oxide island. Four sides or "walls" are formed utilizing silicon and an island is grown within the four sides utilizing the silicon as a crystallizing seed.

If silicon oxide is deposited on the substrate material, amorphous silicon results. Amorphous silicon has poor electrical conduction properties. Depositing silicon oxide is not a preferred method of forming a silicon oxide layer in the present invention.

In the manufacturing of integrated circuit transistors, a typical silicon layer for electron transport is about 1 micron or $10^{-6}$ meters thick. In the 10 present invention, the electron transport layer is approximately 10 nanometers, or $10^{-9}$ meters in thickness.

Next, as illustrated in block 56, the thin silicon lattice structure or electron transport layer is then cracked. Cracking of the lattice structure minimizes thermal transmission resulting from phonon conduction through the thin silicon layer. Fabrication of a thin silicon layer ensures adequate cracking of the thin silicon layer by a subsequent process.

Thermal conductivity in a semiconductor is attributed to two major phenomena. First, mobile electrons which flow from one region of a material to another carry with them small quantities of heat. For the present invention, heat flow due to electrons migration is a desirable type of heat transfer because it is controllable.

A second phenomena which creates thermal conductivity within a semiconductor is often called phonon conduction. Phonon conduction occurs in lattice structures when individual lattice structures exert changes in force on adjacent atomic planes due to vibrations in the lattice structure about normal lattice sites. Phonon thermal conduction is undesirable for a solid state thermal switch. Control of phonon conduction through a switching device cannot be accomplished. Specifically, phonon conduction thermal transfer is unaffected by whether a transistor or a MOSFET is in an OFF state or an ON state.

To minimize heat transfer due to lattice structure vibrational energy, or quiescent heat transfer the present invention introduces cracks into the lattice structure of the electron transport layer.

Figure 3:
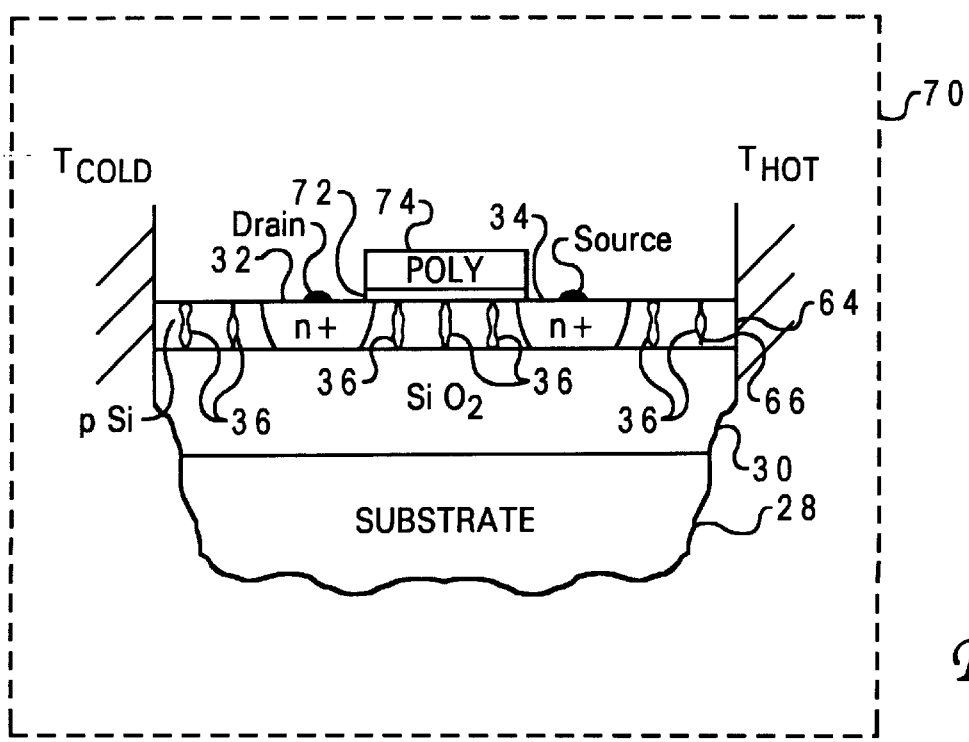
FIG. 3 depicts a solid state thermal switch device which provides thermal conductivity in the ON state and superior thermal impedance in the OFF state in accordance with the method and system of the present invention.

Referring briefly to FIG. 3, a physical embodiment of a solid state thermal switch having enhanced thermal isolation accordance with the present invention is depicted. In FIG. 3, cracks 36 in thin electron transport layer 64 are illustrated.

The present invention is not limited to silicon lattice structures. Silicon germanium multilattice and other compounds can provide enhanced performance for applications which have special requirements.

Next, N wells are etched into thin electron transport layer 64 of FIG. 3 as illustrated in block 58 of FIG. 2. N wells 32 and 34 of FIG. 3 form the drain and source of solid state thermal switch 70. Doping is well known in the manufacture of transistors and will not be discussed herein.

After N wells 32 and 34 are formed, surface oxide layer 72 is formed on top of thin electron transport layer 64 between etched N wells 32 and 34 as in block 60 of FIG. 2. Next, as in a block 62 of FIG. 2, polysilicon layer 74 is formed over surface oxide layer 72 in FIG. 3. The process is then completed in block 68.

Referring to FIG. 3, solid state thermal switch 70 is a traditional metallic oxide semiconducting field effect transistor or a MOSFET with modifications in the thin silicon layer or electron transport layer. Standard MOSFET manufacturing processes commonly known and utilized in the semiconductor industry can effectively be employed to complete many of the required steps of the present invention.

Cracks 36 in thin electron transport layer 64 can be introduced by bombarding thin electron transport layer 64 with fast neutrons 66. As fast neutrons 66 impact thin electron transport layer 64, they penetrate the thin layer and rest close to silicon oxide layer 30. Thin electron transport layer 64 is brittle and as the neutrons embed themselves in thin electron transport layer 64, they create cracks in thin electron transport layer 64. The cracks have a width of approximately one nanometer. The gap caused by the penetration of the fast neutrons greatly reduces the phonon conductivity by spacing or disrupting a selected quantity of adjacent lattice structures.

A lattice structure is a three dimensional periodic arrangement of atoms in space. Generally, the configuration of a lattice structure and the inter- and intra- lattice bonding of the lattice structure determines the thermal conductance of the lattice structure.

As lattice vibrations increase with increasing heat, the cracks in the silicon allow the increased vibrations to occur into the voids created by the cracks without significant phonon conduction of heat to adjacent lattice structures. Lattice structures across the crack from a vibrating lattice structures are less responsive due to the spacing and latitude created by the cracks for lattice vibrations.

Cracks 36 are on the order of a nanometer and, although thermal conductivity is disrupted, electrical conductivity or current flow is virtually unaffected by the cracks. Electrical conduction in a cracked or modified silicon structure is similar to the phenomena of electron tunneling which is well known in the art.

Cracks 36 break the bond between lattice structures at statistically calculated intervals, such that phonon conductivity is greatly reduced. A plutonium neutron having an energy of 11.5 Kev and a total thermal flux of $1\times10^{13}$ neutrons/cm$^2$ provides an acceptable fast neutron for utilization in cracking the thin layer of silicon in the present invention.

The thermal conduction across cracks 36 via embedded fast neutrons 66 is insignificant. After cracking the lattice structure, the silicon is baked to temper the material and relieve stress resulting from larger cracks.

The neutron bombardment process discussed in FIG. 2 must be performed immediately after the silicon deposition because bombardment after completion of the modified MOSFET would cause undesirable imperfections in other parts of the thermal switch structure.

Summarizing in FIG. 3, a silicon oxide layer 30 is formed by oxygen implantation on substrate 28 and subsequent annealing. N wells 32 and 34 are deposited in thin electron transport layer 64. Surface oxide layer 72 is then formed on top of thin electron transport layer 64 and polysilicon layer 74 is then deposited on top of surface oxide layer 72. Silicon oxide layer 30 has a relatively low thermal conductance. The thermal conduction of silicon oxide is 100 times less than the thermal conduction of silicon. Many standard MOSFET manufacturing processes can be utilized effectively by the present invention.

Figure 4:
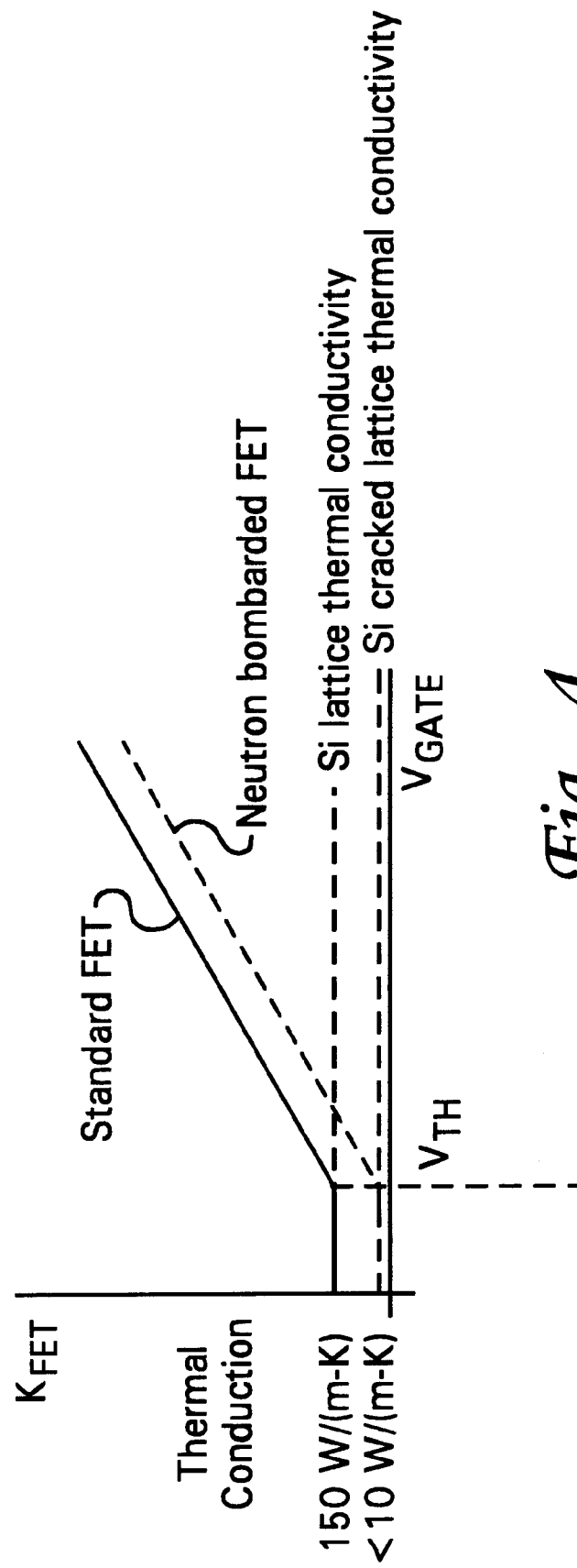
FIG. 4 illustrates thermal conductivity of a standard MOSFET and thermal conductivity of a modified MOSFET in accordance with the method and system of the present invention.

Referring now to FIG. 4, thermal conductivity as a function of gate voltage is depicted for a typical MOSFET and a MOSFET modified for enhanced thermal switching properties. As illustrated, the thermal conduction of a standard MOSFET in an "OFF" state is equal to the silicon thermal lattice conductivity. In an OFF state, the gate voltage of the MOSFET is below the threshold voltage and the thermal conduction is equal to the silicon thermal lattice conductivity. A standard MOSFET in the "OFF" state still has a thermal conductivity on the order of 150 W/m.K. This quiescent heat transfer cannot be controlled through switching. Neutron irradiated silicon has a quiescent thermal conductivity of about 10 W/m.K. The thermal conductivity of silicon germanium multilattices can be as low as 4 W/m.K so that neutron irradiation may not be necessary depending on the application.

As illustrated by the graph of FIG. 4, when the gate voltage of a standard MOSFET is above the threshold voltage of the standard MOSFET, electron flow occurs and the thermal conductivity of the MOSFET increases in proportion to the amount of current flow. However, the quiescent thermal conduction of a typical MOSFET is unacceptable for many applications and causes inefficiencies in Peltier device switching applications.

While the invention has been particularly shown and described with reference to a preferred embodiment, it will be understood by those skilled in the art that various changes in form and detail may be made therein without departing from the spirit and scope of the invention.

What is claimed is:

1. A solid state thermal switch comprising:
   a substrate;
   an oxide layer joined with said substrate;
   a thin electron transport layer having a significant quiescent thermal impedance, said thin electron transport layer joined with said oxide layer;
   a first structure integrated with said thin electron transport layer for coupling a hot sink thereto; and
   a second structure integrated with said thin electron transport layer for coupling a cold source thereto, wherein said significant quiescent thermal impedance of said thin electron transport layer is interposed between said hot sink and said cold source and disrupts thermal lattice conductivity through said thin electron transport layer such that thermal isolation is provided between said cold source and said hot sink in an OFF state of said solid state thermal switch.

2. The solid state thermal switch of claim 1, wherein said thin electron transport layer is a cracked silicon layer.

3. The solid state thermal switch of claim 1, wherein said thin electron transport layer is comprised of silicon germanium multilattice structure.

4. The solid state thermal switch of claim 1, wherein said first structure is a gate and said second structure is a drain.

5. The solid state thermal switch of claim 1, wherein said oxide layer is created on said substrate by separation by implementation of oxygen.

6. The solid state thermal switch of claim 1, wherein said oxide layer is created by selective epitaxial growth.

7. The solid state thermal switch of claim 2, wherein said thin electron transport layer is impregnated with fast neutrons.

8. The solid state thermal switch of claim 1, wherein said first structure is etched on said thin electron transport layer.

9. The solid state thermal switch of claim 1, wherein said second structure is etched on said thin electron transport layer.

10. The solid state thermal switch of claim 1, wherein said hot sink is a Peltier device and said cold source is a heat exchanger.

11. The solid state thermal switch of claim 1, wherein said cold source is a heat exchanger and said hot sink is a Peltier device.

12. The solid state thermal switch of claim 1, further comprising an oxide layer joined with said thin electron transport layer.

13. The solid state thermal switch of claim 12, further comprising a layer of polysilicon joined with said oxide layer.

14. The solid state thermal switch of claim 13, further comprises of a gate connection joined to said polysilicon.

15. The solid state thermal switch of claim 1, wherein said cold source is a circuit.

\* \* \* \* \*